United States Patent
Matsuo et al.

(10) Patent No.: US 8,228,426 B2
(45) Date of Patent: Jul. 24, 2012

(54) SEMICONDUCTOR PACKAGE AND CAMERA MODULE

(75) Inventors: Mie Matsuo, Kamakura (JP); Atsuko Kawasaki, Yokohama (JP); Kenji Takahashi, Tsukuba (JP); Masahiro Sekiguchi, Yokohama (JP); Kazumasa Tanida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 305 days.

(21) Appl. No.: 12/511,099

(22) Filed: Jul. 29, 2009

(65) Prior Publication Data
US 2009/0284631 A1 Nov. 19, 2009

Related U.S. Application Data

(63) Continuation of application No. PCT/JP2008/073883, filed on Dec. 19, 2008.

(30) Foreign Application Priority Data

Dec. 27, 2007 (JP) ................................. 2007-338200

(51) Int. Cl.
*H04N 5/225* (2006.01)
*H01L 21/00* (2006.01)
*H01L 31/062* (2012.01)

(52) U.S. Cl. ........... 348/374; 348/340; 438/64; 257/294

(58) Field of Classification Search .................. 348/335, 348/340, 374; 438/71, 68, 69, 64, 65
See application file for complete search history.

(56) References Cited

U.S. PATENT DOCUMENTS

| | | | |
|---|---|---|---|
| 6,703,689 B2 | 3/2004 | Wada | |
| 7,045,870 B2 | 5/2006 | Wataya | |
| 7,180,149 B2 | 2/2007 | Yamamoto et al. | |
| 7,442,642 B2 | 10/2008 | Dotta | |
| 7,479,627 B2 | 1/2009 | Yoshimoto et al. | |
| 7,808,064 B2 * | 10/2010 | Kawasaki et al. | 257/432 |
| 2004/0212719 A1 * | 10/2004 | Ikeda | 348/340 |
| 2005/0163016 A1 * | 7/2005 | Kimura | 369/112.01 |

(Continued)

FOREIGN PATENT DOCUMENTS

JP 2005-209967 8/2005

(Continued)

OTHER PUBLICATIONS

Office Action issued Apr. 12, 2011, Japanese Patent Application No. 2007-338200 (with English-language translation).

*Primary Examiner* — John Villecco
(74) *Attorney, Agent, or Firm* — Oblon, Spivak, McClelland, Maier & Neustadt, L.L.P.

(57) ABSTRACT

A semiconductor package includes a solid-state imaging element, electrode pad, through-hole electrode, and light-transmitting substrate. The solid-state imaging element is formed on the first main surface of a semiconductor substrate. The electrode pad is formed on the first main surface of the semiconductor substrate. The through-hole electrode is formed to extend through the semiconductor substrate between the first main surface and a second main surface opposite to the electrode pad formed on the first main surface. The light-transmitting substrate is placed on a patterned adhesive to form a hollow on the solid-state imaging element. The thickness of the semiconductor substrate below the hollow when viewed from the light-transmitting substrate is larger than that of the semiconductor substrate below the adhesive.

15 Claims, 10 Drawing Sheets

U.S. PATENT DOCUMENTS

| | | | |
|---|---|---|---|
| 2007/0235882 A1* | 10/2007 | Sekiguchi et al. | 257/777 |
| 2008/0042227 A1 | 2/2008 | Asano et al. | |
| 2008/0283951 A1* | 11/2008 | Nabe et al. | 257/433 |
| 2009/0014762 A1* | 1/2009 | Matsuo et al. | 257/292 |
| 2009/0059055 A1* | 3/2009 | Nakano et al. | 348/340 |
| 2009/0283847 A1* | 11/2009 | Kawasaki et al. | 257/432 |
| 2010/0053318 A1* | 3/2010 | Sasaki | 348/125 |
| 2011/0024858 A1* | 2/2011 | Yoshihara et al. | 257/432 |
| 2012/0044415 A1* | 2/2012 | Tsuduki et al. | 348/374 |

FOREIGN PATENT DOCUMENTS

| | | |
|---|---|---|
| JP | 2006-28837 | 2/2006 |
| JP | 2006-100435 | 4/2006 |
| JP | 2007-134725 | 5/2007 |
| JP | 2007-134735 | 5/2007 |
| JP | 2007123909 A * | 5/2007 |
| JP | 2007-214360 | 8/2007 |
| JP | 2007-273629 | 10/2007 |

* cited by examiner

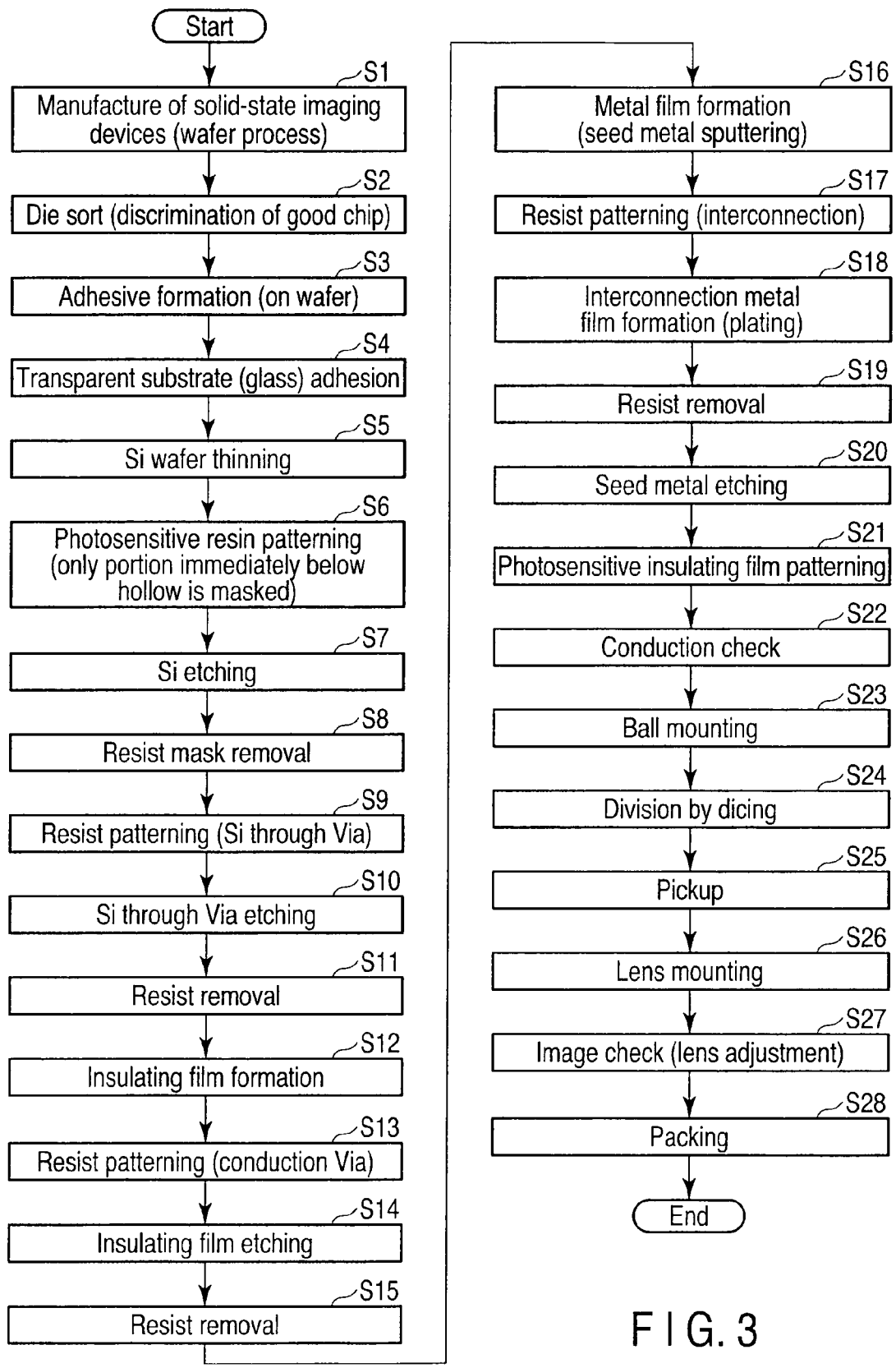
F I G. 3

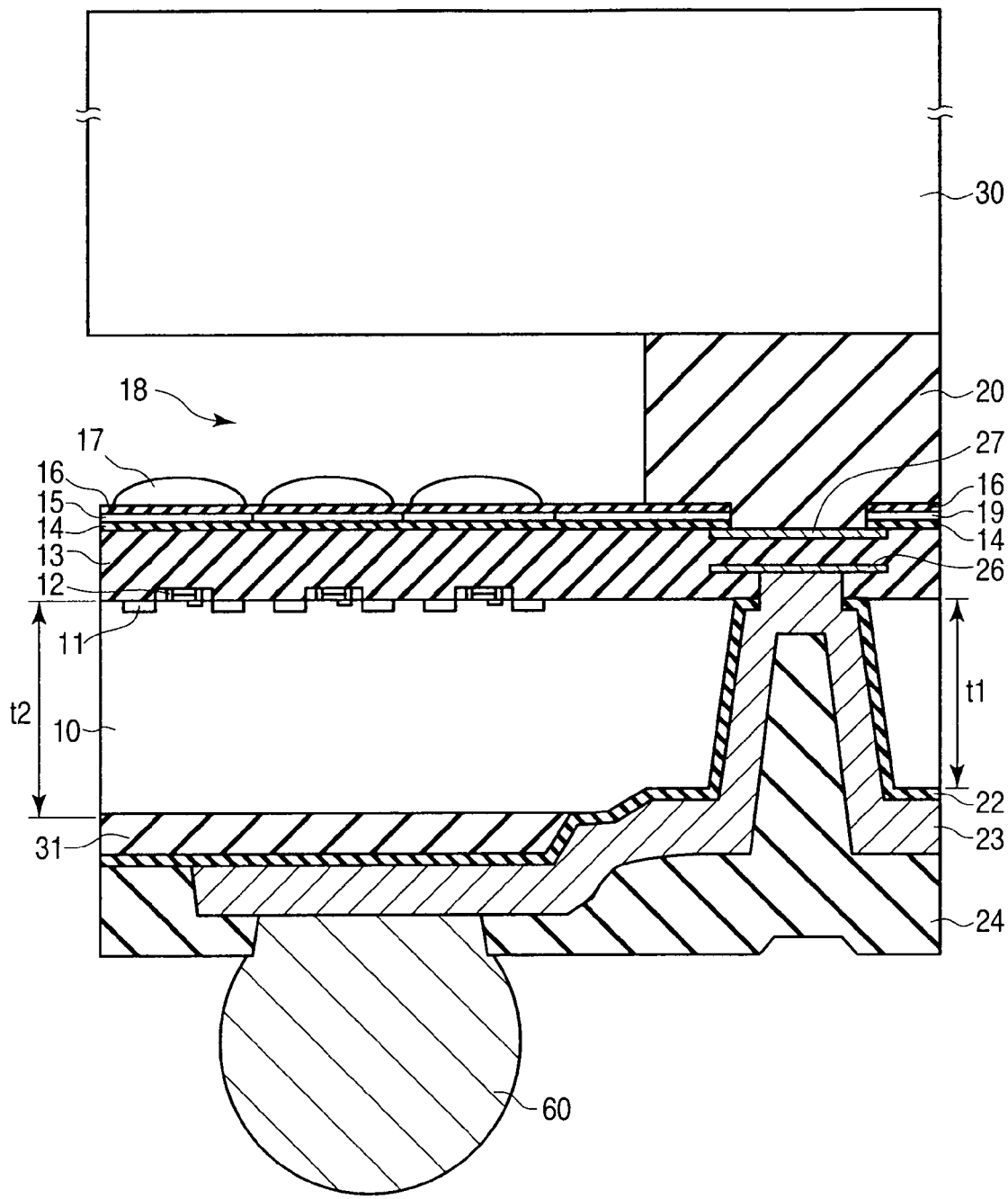
F I G. 4

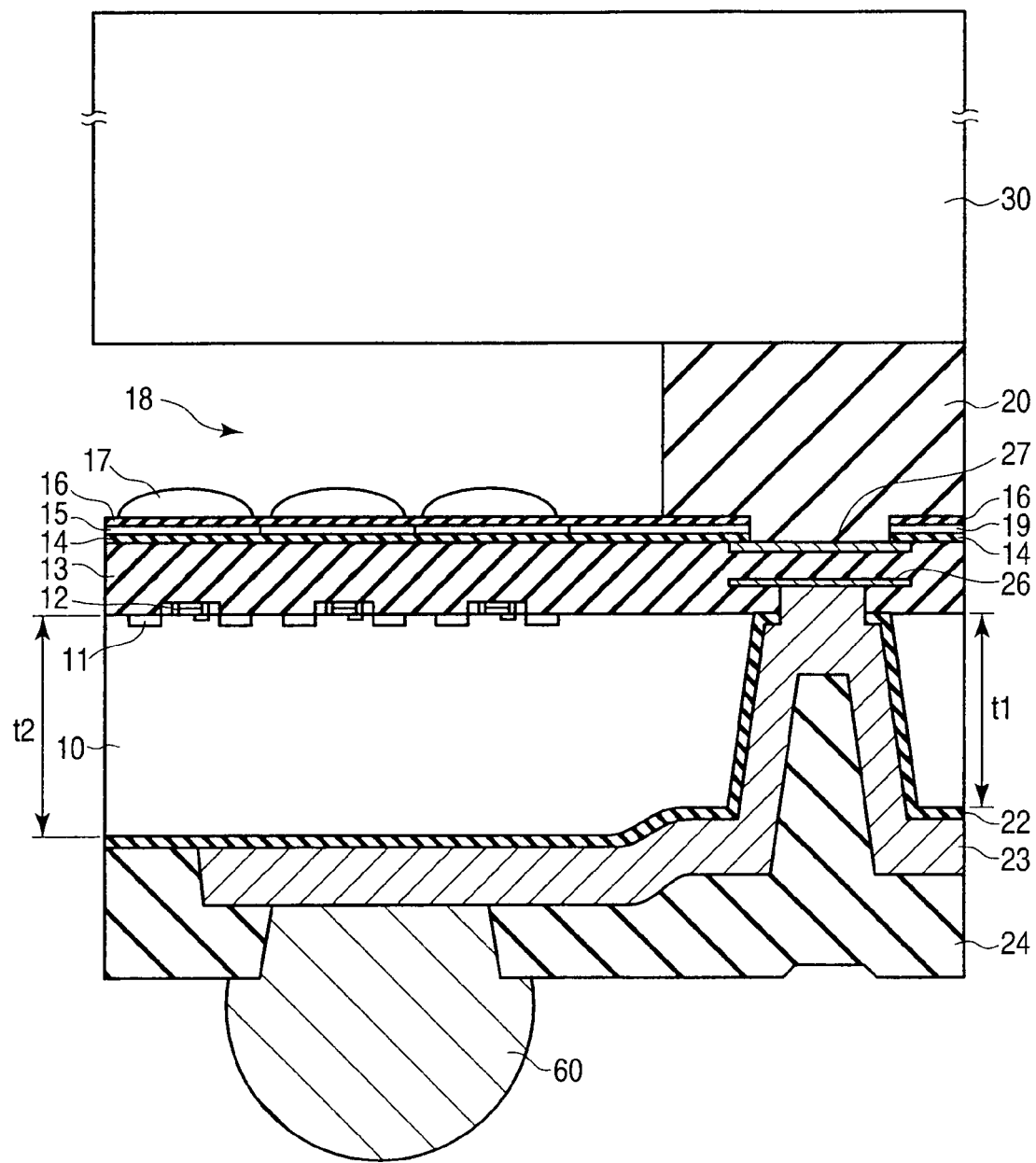
F I G. 6

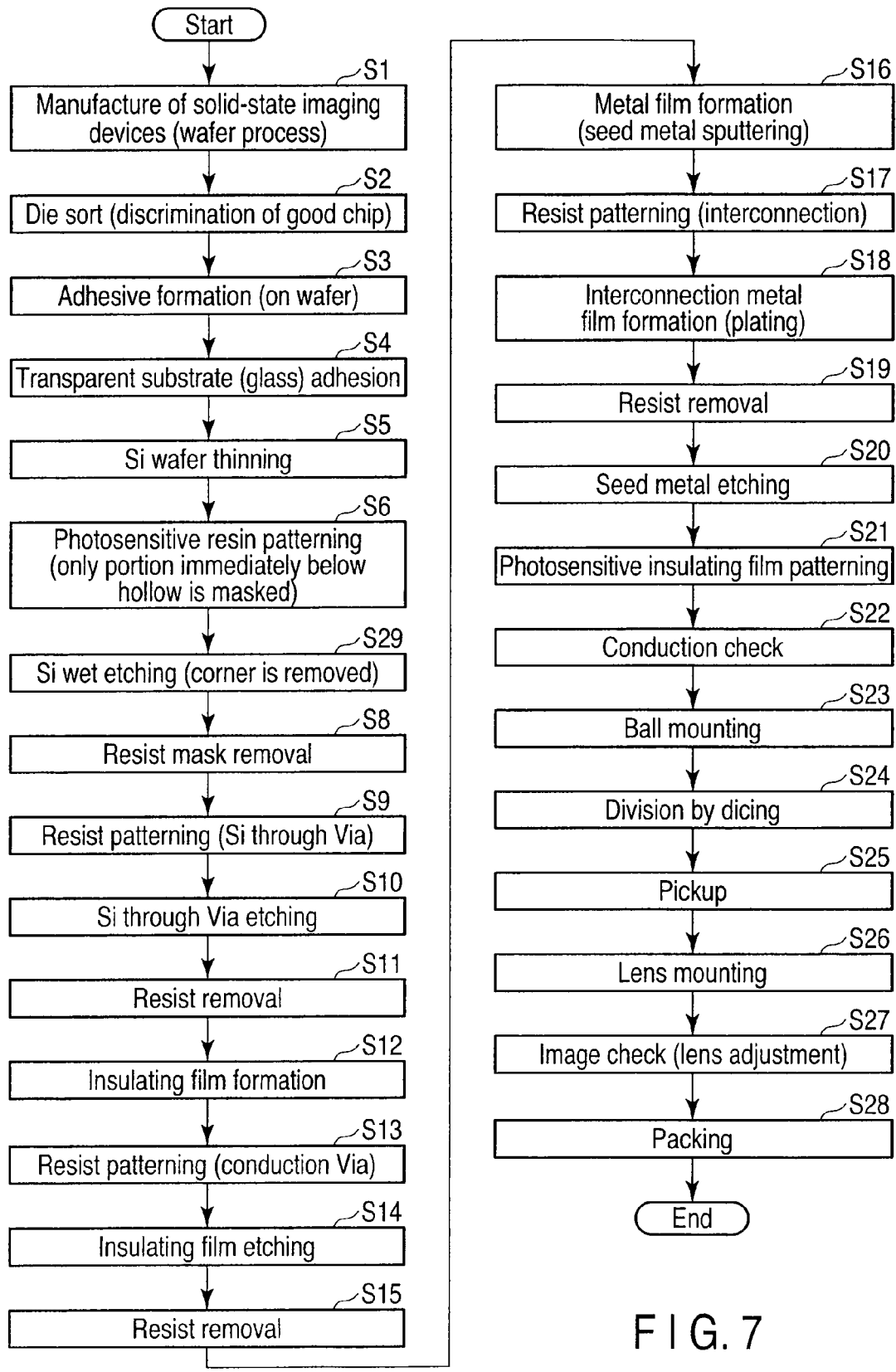
F I G. 7

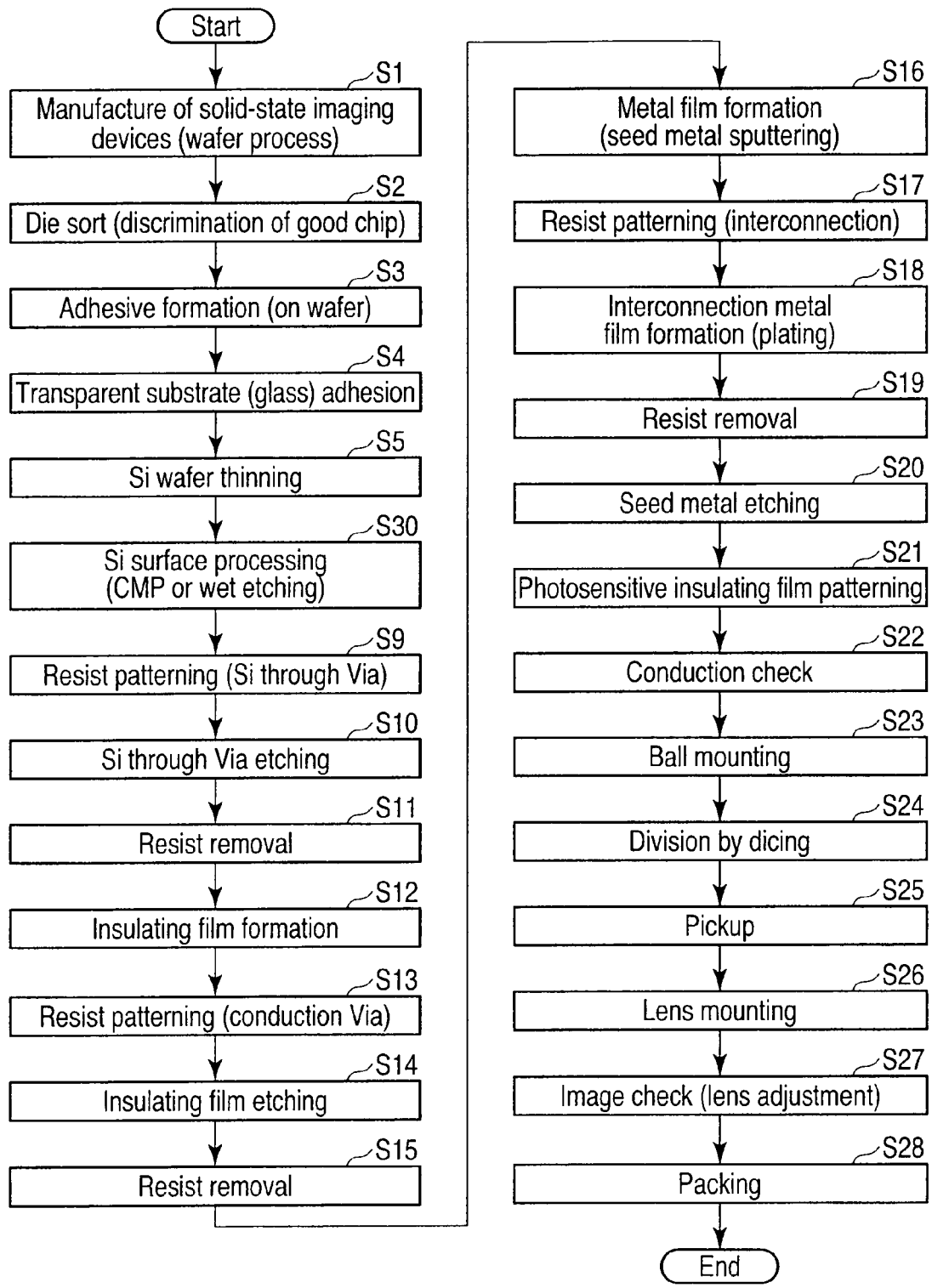
F I G. 8

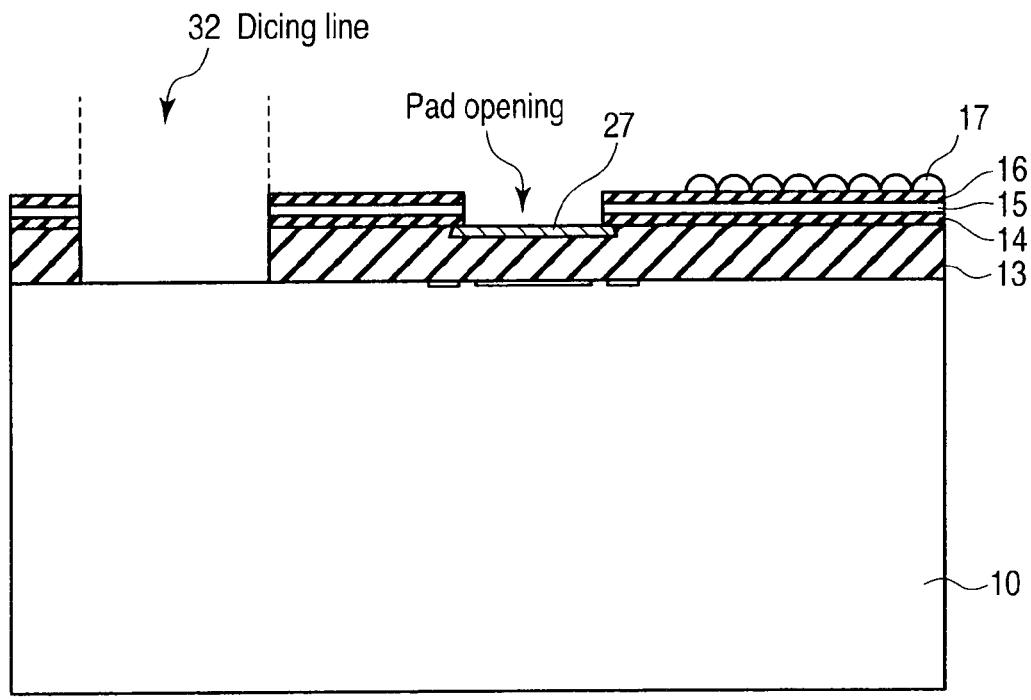
F I G. 11
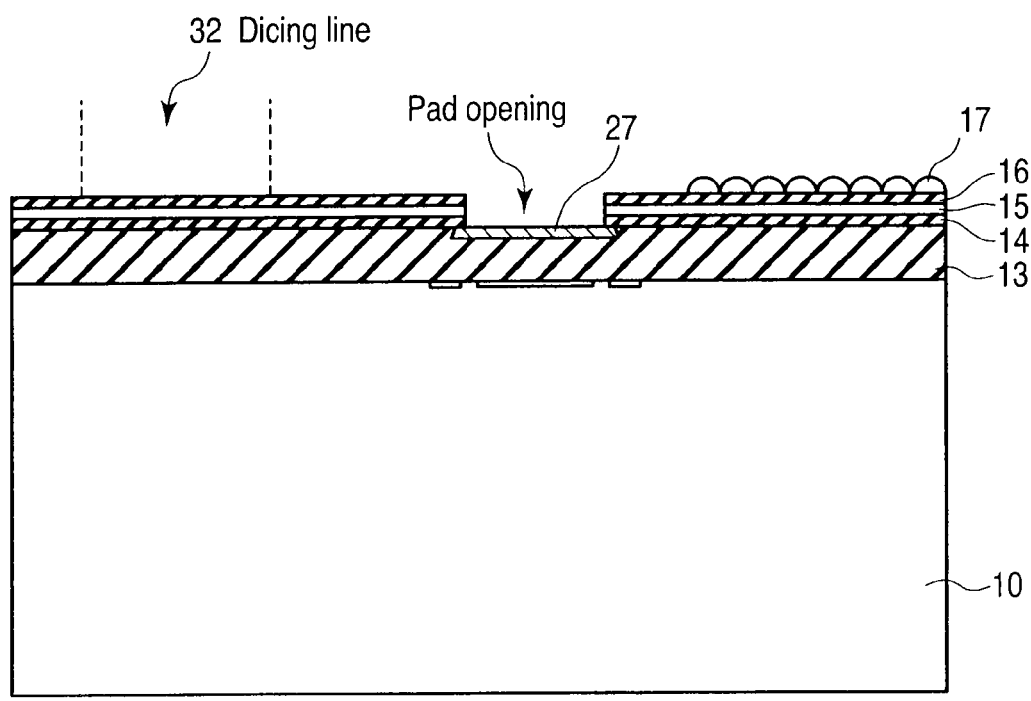
F I G. 12

SEMICONDUCTOR PACKAGE AND CAMERA MODULE

CROSS-REFERENCE TO RELATED APPLICATIONS

This is a Continuation Application of PCT Application No. PCT/JP2008/073883, filed Dec. 19, 2008, which was published under PCT Article 21(2) in English.

This application is based upon and claims the benefit of priority from prior Japanese Patent Application No. 2007-338200, filed Dec. 27, 2007, the entire contents of which are incorporated herein by reference.

BACKGROUND OF THE INVENTION

1. Field of the Invention

The present invention relates to a semiconductor package using a solid-state imaging element, and a camera module using the semiconductor package.

2. Description of the Related Art

Recently, video cameras and digital cameras are in widespread use, and charge coupled device (CCD) type and amplification type solid-state imaging elements are used in these cameras. In particular, with the spread of portable electronic apparatuses such as cell phones, PDAs, and notebook computers, demands for decreasing the size, weight, thickness and, cost of a camera module are increasing.

An amplification type solid-state imaging element (CMOS image sensor) used as, e.g., an imaging element in a conventional compact camera module has an imaging pixel portion in which a plurality of pixels are two-dimensionally arranged in one semiconductor chip, and a peripheral circuit portion formed outside the imaging pixel portion. The amplification type solid-state imaging element has various MOS transistors for, e.g., transfer and amplification in each pixel of the imaging pixel portion. A photodiode generates signal charge by photoelectrically converting light having entered each pixel, and the transfer transistor and amplification transistor convert the signal charge into an electrical signal and amplify the signal. The signal of the pixel is then output to the peripheral circuit portion through a signal line.

A color filter for acquiring a color image is formed on the photodiode, and a microlens for efficiently concentrating light is formed on the color filter. The imaging element chip having the above arrangement is directly mounted (by COB: chip on board) on a printed circuit board made of a resin or ceramic. An electrode is connected by wire bonding, and a passive element is mounted on the surface (by SMT:surface mount technology). A lens holder including a cover lens is placed on the printed circuit board and adhered to it, thereby forming a camera module.

In this method, the mounting area is larger than the area of the imaging element, and this makes it impossible to unlimitedly increase the density (decrease the size, weight, and thickness). It is also difficult to reduce the cost because the number of constituent parts is large and the mounting process is complicated. Furthermore, it is necessary in the manufacturing process to thin the semiconductor substrate by grinding the back surface by using a grinder and divide the substrate by dicing while the light-receiving surface is exposed. This poses the problem that dust particles stick to the light-receiving surface and decrease the yield.

Recently, as a method of solving these problems, a package in which a light-transmitting member is adhered on the light-receiving surface and an electrode is extracted from the surface opposite to the light-receiving surface of a silicon substrate has been proposed (e.g., Jpn. Pat. Appln. KOKAI Publication No. 2007-134735).

In these compact camera modules, when extracting an electrode extending through a semiconductor substrate from an electrode on the first main surface on which the photodiode and transistor are formed to the second main surface as the back surface of the semiconductor substrate, the thickness of the semiconductor substrate must be decreased to, e.g., about 100 μm in order to increase the manufacturing throughput.

In addition, to efficiently concentrate light to the photodiode, the microlens must be covered with a member having a refractive index lower than that of the formed microlens material. Therefore, a hollow structure in which the space above the microlens is filled with a gas (atmospheric-pressure or low-pressure ambient) having the lowest refractive index is often used. A transparent member is placed above the microlens with the hollow being interposed between them. This transparent member is spaced apart from the microlens by a patterned adhesive.

Unfortunately, when the hollow is formed on the imaging element including the photodiode and the semiconductor substrate is thinned, the semiconductor substrate decreases its strength and breaks in the region where the hollow is formed. Even when the semiconductor substrate does not break, it bends in the region where the hollow is formed, and this makes normal image display impossible.

BRIEF SUMMARY OF THE INVENTION

According to a first aspect of the present invention, there is provided a first semiconductor package comprising: a solid-state imaging element formed on a first main surface of a semiconductor substrate; an electrode pad formed on the first main surface of the semiconductor substrate; a through-hole electrode formed to extend through the semiconductor substrate between the first main surface and a second main surface opposite to the electrode pad formed on the first main surface; and a light-transmitting substrate placed on a patterned adhesive to form a hollow on the solid-state imaging element. A thickness of the semiconductor substrate below the hollow when viewed from the light-transmitting substrate is larger than that of the semiconductor substrate below the adhesive.

According to a second aspect of the present invention, there is provided a second semiconductor package comprising: a solid-state imaging element formed on a first main surface of a semiconductor substrate; an electrode pad formed on the first main surface of the semiconductor substrate; a through-hole electrode formed to extend through the semiconductor substrate between the first main surface and a second main surface opposite to the electrode pad formed on the first main surface; and a light-transmitting substrate placed on a patterned adhesive to form a hollow on the solid-state imaging element. The second main surface of the semiconductor substrate below the adhesive when viewed from the light-transmitting substrate is recessed more than that of the semiconductor substrate below the hollow.

According to a third aspect of the present invention, there is provided a camera module comprising: one of the first and second semiconductor packages; an infrared cut filter formed on the light-transmitting substrate of the semiconductor package; and an imaging lens formed on the infrared cut filter.

BRIEF DESCRIPTION OF THE SEVERAL VIEWS OF THE DRAWING

FIG. 3 is a process flowchart showing a method of manufacturing the camera module of the first embodiment;

FIG. 4 is an enlarged sectional view of portions of a silicon semiconductor substrate and glass substrate in a camera module of a second embodiment of the present invention;

FIG. 6 is an enlarged sectional view of portions of a silicon semiconductor substrate and glass substrate in a camera module of a third embodiment of the present invention;

FIG. 7 is a process flowchart showing a method of manufacturing the camera module of the third embodiment;

FIG. 8 is a process flowchart showing another method of manufacturing the camera module of the third embodiment;

FIG. 11 is a sectional view showing a dicing line structure in another conventional camera module; and FIG. 12 is a sectional view showing a dicing line structure in another camera module of the embodiment of the present invention.

DETAILED DESCRIPTION OF THE INVENTION

Embodiments of the present invention will be explained below with reference to the accompanying drawings. In the following explanation, the same reference numbers denote the same parts throughout the drawings.

[First Embodiment]

First, a camera module of the first embodiment of the present invention will be explained below.

Figure 1:
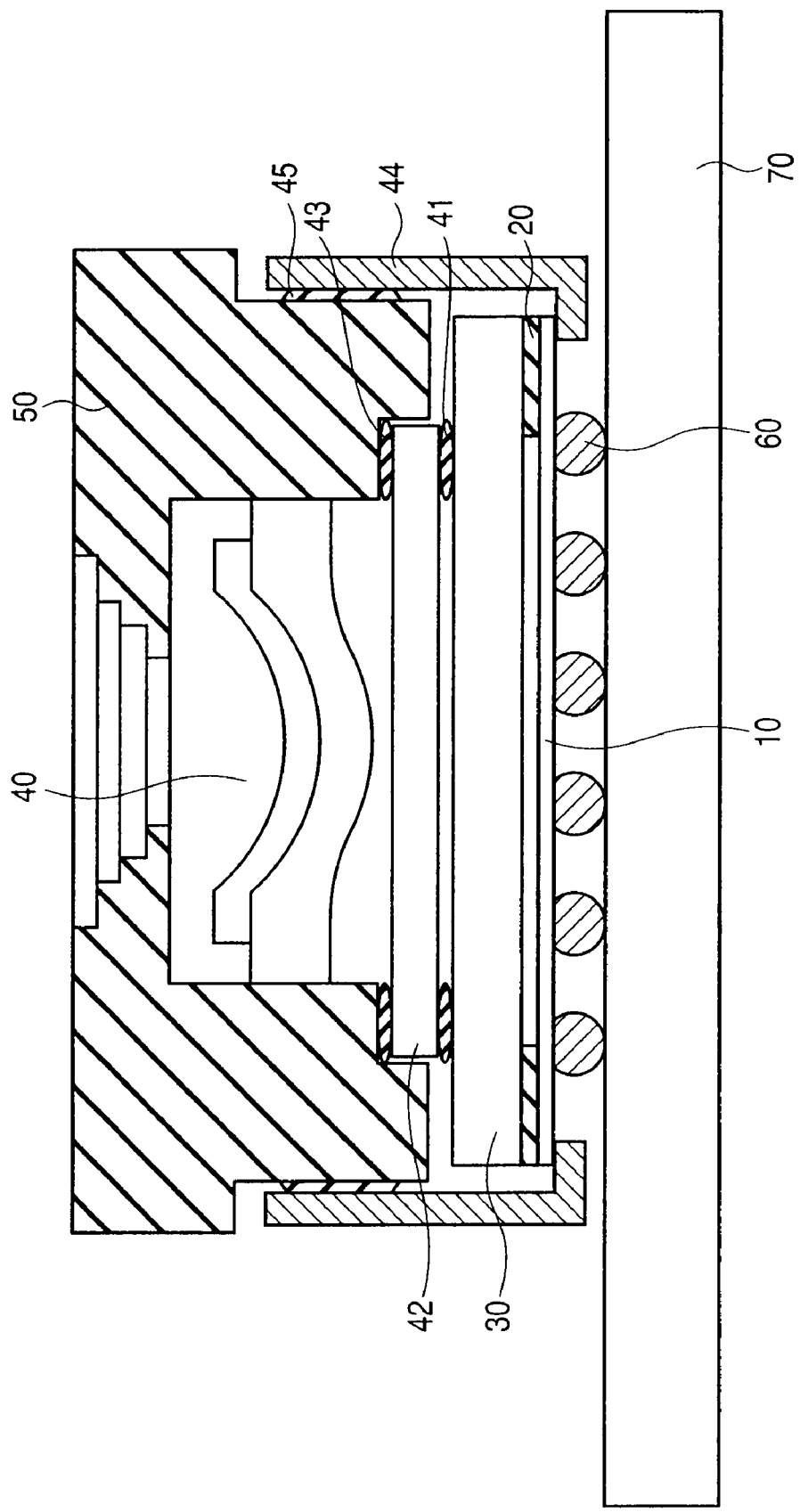
FIG. 1 is a sectional view showing the arrangement of a camera module of a first embodiment of the present invention.

FIG. 1 is a sectional view showing the arrangement of the camera module of the first embodiment. Imaging elements (not shown) are formed on the first main surface of a silicon semiconductor substrate (imaging element chip) 10. A light-transmitting substrate (transparent substrate), e.g., a glass substrate 30 is formed on an adhesive 20 on that region of the first main surface of the silicon semiconductor substrate 10, in which the imaging elements are not formed. An IR (InfraRed) cut filter 42 is formed on an adhesive 41 on the glass substrate 30, and a lens holder 50 including an imaging lens 40 covers the IR cut filter 42 with an adhesive 43 being interposed between them. The camera module is formed by adhering these components. Also, external terminals, e.g., solder balls 60 are formed on the second main surface of the silicon semiconductor substrate 10. A light-shielding electromagnetic shield 44 is formed around the semiconductor substrate 10 and glass substrate 30, and adhered to the lens holder 50 by an adhesive 45. After that, for example, the silicon semiconductor substrate 10 is directly mounted (by COB: chip on board) on a printed circuit board 70 made of a resin or ceramic with the solder balls 60 being interposed between them.

The sectional structure of the silicon semiconductor substrate 10 and glass substrate 30 shown in FIG. 1 will be explained in detail below.

Figure 2:
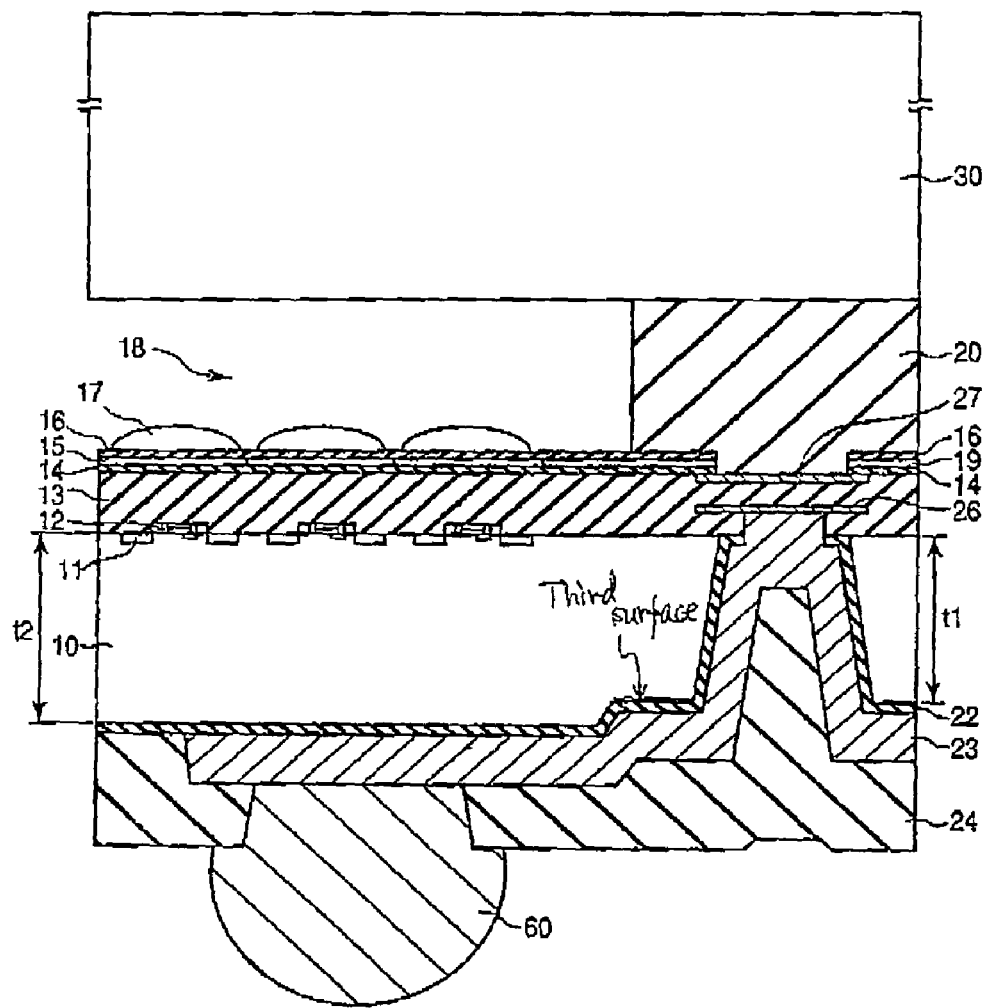
FIG. 2 is an enlarged sectional view of portions of a silicon semiconductor substrate and glass substrate in the camera module of the first embodiment.

FIG. 2 is an enlarged sectional view of portions of the silicon semiconductor substrate 10 and glass substrate 30 in the camera module. The camera module has an imaging pixel portion in which a plurality of imaging elements 12 are two-dimensionally arranged, and a peripheral circuit portion that is formed in a region except for this imaging pixel portion and processes signals output from the imaging pixel portion.

The imaging pixel portion of the camera module has the following arrangement. As shown in FIG. 2, shallow trench isolations (STIs) 11 as element isolation insulating layers and element regions divided by the STIs 11 are arranged on the first main surface of the silicon semiconductor substrate 10. The imaging element 12 including a photodiode and transistor is formed in each element region. An interlayer dielectric film 13 is formed on the first main surface on which the imaging elements 12 are formed.

A base layer 14 is formed on the interlayer dielectric film 13. Color filters 15 are arranged on the base layer 14 so as to be opposed to the imaging elements 12. An overcoat 16 is formed on the color filters 15, and microlenses 17 are formed on the overcoat 16 so as to be opposed to the imaging elements 12 (color filters 15). A hollow 18 is formed on the microlenses 17, and the glass substrate 30 is placed on the hollow 18.

The individual parts described above are made of, e.g., the following materials. The STIs 11 are made of $SiO_2$, and the interlayer dielectric film 13 is made of $SiO_2$ or SiN. The color filters 15 are made of an acrylic resin, and the microlenses 17 are made of a styrene-based resin.

In the peripheral circuit portion of the camera module, a through-hole electrode and electrode pads to be described below are formed. A through hole is formed in the silicon semiconductor substrate 10 from the second main surface opposite to the first main surface to the first main surface. An insulating film 22 is formed on the inner circumferential surface of the through hole and on the second main surface. A conductor layer 23 is formed on the insulating film 22. A protective film, e.g., a solder resist 24 is formed on the conductor layer 23. The solder resist 24 on the conductor layer 23 is partially open, and the solder ball 60 is formed on the exposed conductor layer 23. Note that the solder ball 60 is also formed on the second main surface of the silicon semiconductor substrate 10 below the imaging pixel portion.

The solder resist 24 is made of, e.g., a phenol-based resin, polyimide-based resin, or amine-based resin. The solder ball 60 is made of, e.g., Sn—Pb (eutectic), 95Pb—Sn (high-lead, high-melting-point solder), or Pb-free solder such as Sn—Ag, Sn—Cu, or Sn—Ag—Cu.

Also, the interlayer dielectric film 13 is formed on the first main surface of the silicon semiconductor substrate 10. The conductor layer 23 formed in the through hole reaches the first main surface, and an internal electrode (first electrode pad) 26 is formed on the conductor layer 23. The internal electrode 26 is electrically connected to the imaging element 12 or a peripheral circuit (not shown) formed in the peripheral circuit portion. Accordingly, a through-hole electrode formed in the through hole electrically connects the solder ball 60 and the imaging element 12 or peripheral circuit.

An element surface electrode (second electrode pad) 27 is formed on the internal electrode 26 with the interlayer dielectric film 13 being interposed between them. In the interlayer dielectric film 13 between the internal electrode 26 and element surface electrode 27, a contact plug (not shown) for electrically connecting these electrodes is formed. The element surface electrode 27 is used to apply a voltage or read out a signal via the contact plug and internal electrode 26. Especially when conducting a die sort test, a needle is brought into contact with the element surface electrode 27.

The base layer 14 is formed on the element surface electrode 27. An acrylic resin 19 is formed on the base layer 14, and the overcoat 16 is formed on the acrylic resin 19. A pad opening is formed through the base layer 14, acrylic resin 19, and overcoat 16 formed on the element surface electrode 27.

The glass substrate 30 is formed on an adhesive 20 on the overcoat 16 and element surface electrode 27. Note that the adhesive 20 is patterned and is not formed on the imaging elements 12 (microlenses 17), i.e., on the imaging pixel portion. As described previously, the hollow 18 is formed on the imaging pixel portion, and the glass substrate 30 is placed on the hollow 18.

The thickness of the silicon semiconductor substrate 10 below the hollow 18 when viewed from the glass substrate 30 is made larger than that of the silicon semiconductor substrate 10 below the adhesive 20. For example, letting t1 be the thickness of the silicon substrate 10 below the adhesive 20 and t2 be that of the silicon substrate 10 below the hollow 18, t1<t2 holds. The thickness t2 is desirably larger by 1.5 μm or more than the thickness t1. In other words, the second main surface of the silicon substrate 10 below the adhesive 20 when viewed from the glass substrate 30 is recessed more than that of the silicon substrate 10 below the hollow 18.

In the first embodiment having the above-mentioned structure, the thickness of the silicon substrate 10 is small in at least the periphery of the through hole (through-hole electrode) below the adhesive 20 when viewed from the glass substrate 30. This facilitates processing of the through hole, and increases the efficiency of the manufacture of the camera module. Also, since the silicon substrate 10 in a region except for the periphery of the through hole is thicker than that in the periphery of the through hole, the strength of the silicon substrate 10 is high. This makes it possible to prevent the problem that the silicon substrate 10 in the region where the hollow 18 is formed is destroyed, or the silicon substrate 10 in the region where the hollow 18 is formed bends to make normal image display impossible.

In other words, the thickness of the silicon substrate 10 below the region where the hollow 18 is formed when viewed from the glass substrate 30, i.e., below the imaging pixel portion is made larger than that of the silicon substrate 10 below the non-hollow region on which the glass substrate 30 is adhered by the adhesive 20. Since this prevents easy cracking and bent of the silicon substrate 10 below the region where the hollow 18 is formed, a highly reliable camera module can be formed.

Note that in this embodiment, the pad opening is formed through the base layer 14, acrylic resin 19, and overcoat 16 on the element surface electrode 27. However, it is also possible to use a structure in which no pad opening is formed through these films.

A method of manufacturing the camera module of the first embodiment of the present invention will be explained below. FIG. 3 is a process flowchart showing the camera module manufacturing method of the first embodiment.

First, solid-state imaging devices are formed on a silicon semiconductor substrate (wafer) 10 (step S1). That is, imaging elements 12 each including a photodiode and transistor are formed on the silicon substrate 10. In addition, an internal electrode 26, an interlayer dielectric film 13, an element surface electrode 27, color filters 15, and microlenses 17 are formed on the silicon substrate 10. Subsequently, a die sort test is conducted on each chip including the imaging elements 12, thereby checking whether the chip normally operates (step S2). In the die sort test, the needle of a tester touches the element surface electrode 27.

Then, an adhesive 20 is formed on the first main surface (element formation surface) of the silicon substrate 10 by spin coating or lamination. The adhesive 20 has a function of allowing patterning by lithography and a function of holding the patterned shape, in addition to an adhering function. The adhesive 20 formed on the silicon substrate 10 is patterned by lithography such that the imaging elements 12 are exposed, i.e., the adhesive 20 is not formed on the imaging elements 12 (step S3). After that, the silicon substrate 10 having the adhesive 20 is adhered to a glass substrate 30 (step S4).

The silicon substrate 10 is then thinned by scraping the second main surface by back grinding or the like (step S5). Streaks remain on the back-ground silicon surface, and the surface roughness reaches a few μm to 10 μm. If the process directly advances to lithography and RIE in the subsequent steps, a lithography error or RIE error may occur. Therefore, the second main surface is desirably planarized by, e.g., chemical mechanical polish (CMP) or wet etching.

Also, the variation in thickness of the silicon substrate 10 must fall within the range of average value ±5 μm. If the thickness of the silicon substrate varies in the plane, insufficient etching occurs in a portion where silicon is thick and a scoop called notching is formed on the bottom of a portion where silicon is thin in the next RIE step.

Then, a photosensitive resin is applied and patterned to leave a resin mask pattern on only the second main surface of the silicon substrate 10 immediately below a hollow 18 (step S6). Subsequently, the second main surface of the silicon substrate 10, which is not protected by the resin mask pattern is etched. That is, the second main surface of the silicon substrate 10 immediately below the adhesive 20 is etched (step S7). By this etching, the second main surface of the silicon substrate 10 immediately below the adhesive 20 is etched to make the thickness of the silicon substrate 10 immediately below the adhesive 20 smaller than that of the silicon substrate 10 immediately below the hollow 18. The etched region includes a region where a through hole is formed in a later step. After that, the resist mask pattern is removed (step S8).

Then, the second main surface of the silicon substrate 10 is coated with a resist, and a hole is formed by lithography in a position opposite to a pad opening in the first main surface of the silicon substrate 10 (step S9). In this step, a means such as a double-side aligner or double-side stepper may be used in order to align the opening in the second main surface with an alignment mark (not shown) on the first main surface. Subsequently, a though hole is formed by using the patterned resist as a mask (step S10).

First, only silicon of the silicon substrate 10 is etched by RIE. A silicon device process of forming the imaging elements 12 and transistors normally advances in the order of well formation, shallow trench isolation (STI) formation, source/drain formation, gate/electrode formation, and interconnection formation. In STI formation, the CMP rules inhibit the formation of neither a silicon hill exceeding a certain size nor a shallow trench exceeding a certain size. If a large-size silicon hill exists during CMP, a CMP residue may be produced on the hill. If a large-size shallow trench exists, over-polishing may occur in the trench. In either case, misalignment may occur in the subsequent lithography step, or disconnection of metal interconnections in an upper layer may occur. Therefore, a dummy STI is normally formed in a portion of the silicon substrate where a giant pattern such as an electrode pad is to be formed, thereby preventing violation of the CMP rules.

When forming a through-hole electrode, however, it is important to form no STI below an electrode pad even against the CMP rules. This is so because the type of gas of RIE of silicon differs from that of gas of RIE of an insulating film. That is, if an insulating film pattern exists in silicon during RIE of silicon, an etching error may occur in this portion to form a frog-like etching residue. If a CMP residue is inevitably produced below an electrode pad during CMP of the STI, it is necessary to form a hole by lithography in the portion where the residue is produced, and perform CMP after the material is partially etched by wet etching or the like, thereby eliminating the CMP residue.

Also, the shape of the through hole formed in the silicon substrate by RIE is desirably a tapered shape that gradually narrows from the opening in the second main surface toward the interior. If an inverse taper is formed by notching or bowing, an error may occur in the formation of an insulating film by chemical vapor deposition (CVD) or in the formation of a metal seed layer by sputtering.

A layer of the interlayer dielectric film 13, which is in direct contact with the silicon substrate 10, or the gate insulating film formed on the silicon substrate serves as a stopper in RIE of silicon. Subsequently, the resist is removed by ashing and wet cleaning (step S11). Note that the RIE residue is preferably removed by performing HF-based wet cleaning after silicon RIE or resist removal.

Then, an insulating film 22 made of $SiO_2$, SiON, or SiN is formed on the entire second main surface by CVD or the like (step S12).

A resist is applied again, a hole is formed in only the bottom of the through hole in the silicon substrate (step S13), and RIE of the insulating film 22 is performed by using the resist as a mask (step S14). In this RIE of the insulating film 22, the preformed CVD insulating film and all the insulating films formed between the silicon substrate 10 and internal electrode 26 by the silicon device process are etched. In this step, the internal electrode 26 functions as a stopper during RIE of the insulating films.

Subsequently, the resist is removed by ashing and wet cleaning (step S15). Note that the surface of the internal electrode 26 is desirably slightly etched by alkali-based wet etching because the surface may be oxidized by about a few nm to a few ten nm.

A metal seed layer is formed on the insulating film 22 and internal electrode 26 by sputtering (step S16). In this sputtering process, the oxide layer on the surface of the internal electrode 26 is preferably removed first by reverse sputtering. Subsequently, a metal seed such as Ti or Cu is sputtered. Note that to prevent corrosion on the surface of the internal electrode 26, the time between RIE of the insulating film 22 and metal seed sputtering is desirably 3 hrs or less, and 24 hrs or less at longest.

Then, a resist is applied for electrode patterning on the second main surface, and patterned by lithography so as to be left behind in only a portion where no electrode is to be formed (step S17). The metal seed layer is plated by electroplating or the like, and a through-hole electrode and interconnections are formed (step S18). After that, the resist is removed by wet etching or the like (step S19). Subsequently, the metal seed is etched by, e.g., wet cleaning, thereby exposing the insulating film 22 in regions except for the through-hole electrode and interconnections (step S20). Note that it is also possible to first perform non-masking electroplating, and then form the through-hole electrode and interconnections by lithography and etching. If this method is used, however, the amount of plating solution to be used increases, and this makes the process expensive.

Then, a solder resist 24 is formed on the entire second main surface by, e.g., spin coating. A hole is formed in the solder resist 24 by lithography in only a region on which a solder ball 60 is to be mounted (step S21). After that, conduction check is performed (step S22), and the solder ball 60 is mounted on a conductor layer 23 in the hole of the solder resist 24 (step S23).

Finally, the silicon substrate 10 is divided by dicing (step S24), and pickup (step S25), lens mounting (step S26), and image check (lens adjustment) (step S27) are performed. After that, the manufacture of the camera module is completed by packing it up (step S28).

[Second Embodiment]

Next, a camera module of the second embodiment of the present invention will be explained. The same reference numbers as in the arrangement of the above-mentioned first embodiment denote the same parts, and a repetitive explanation will be omitted.

FIG. 4 is an enlarged sectional view of portions of a silicon semiconductor substrate and glass substrate in the camera module of the second embodiment.

A resin mask pattern 31 for reinforcement is formed on the second main surface of a silicon substrate 10 below a hollow 18 in a direction perpendicular to the surface of the silicon substrate 10. This further increases the strength of the silicon substrate 10 below the hollow 18 compared to the first embodiment, and makes it possible to prevent the problem that the silicon substrate 10 below the hollow 18 is destroyed, or the silicon substrate in this region bends to make normal image display impossible. The rest of the arrangement and the effects are the same as those of the first embodiment.

Note that the resin mask pattern 31 is the mask used to etch the second main surface of the silicon substrate 10 in the region (below the adhesive 20) except for the portion below the hollow 18 in the manufacturing method of the first embodiment, so the resin mask pattern 31 can be formed by leaving this mask behind without removing it. Accordingly, a manufacturing method of the second embodiment requires no additional process, and can eliminate the step (step S8) of removing the resin mask pattern 31.

Figure 5:
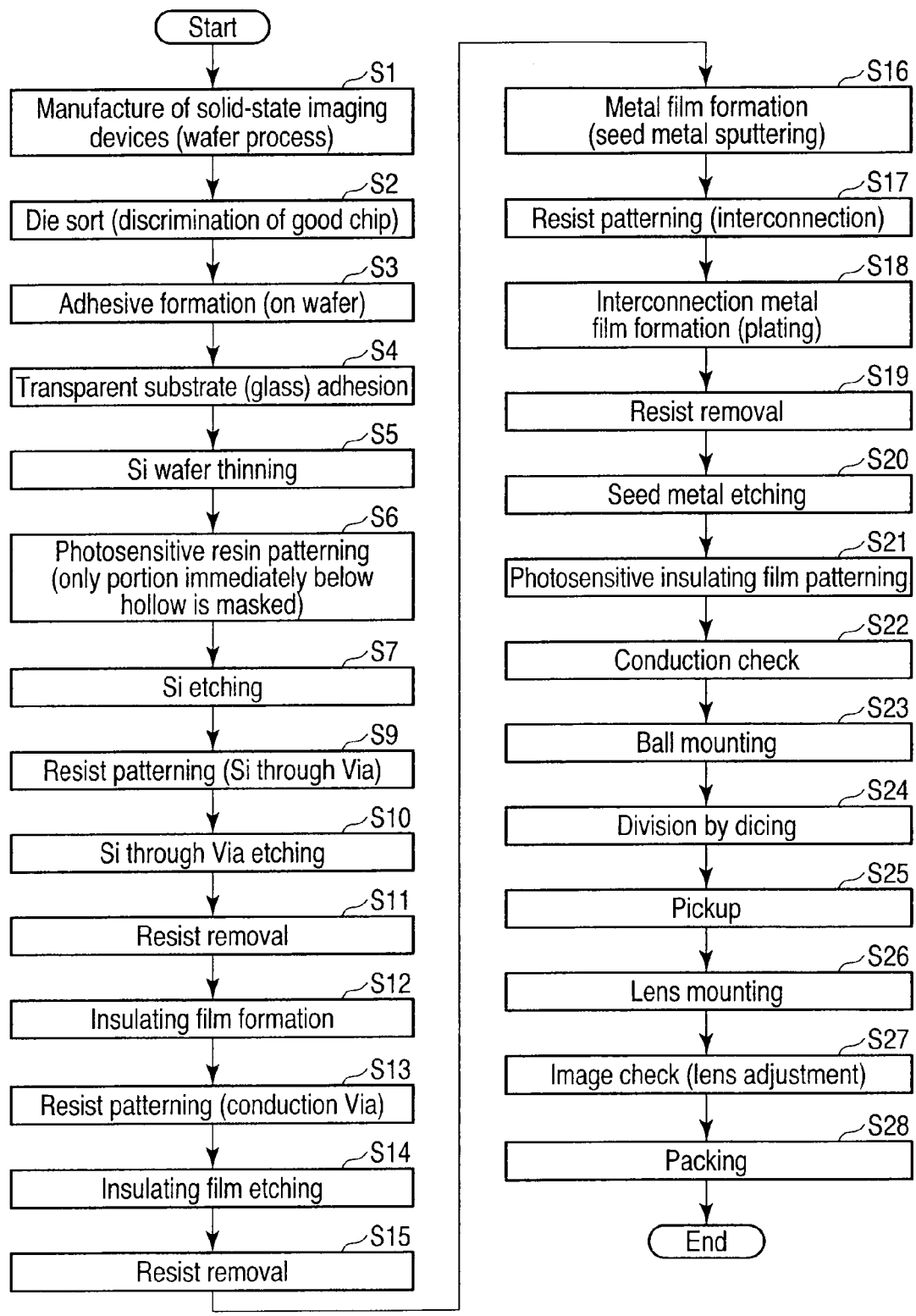
FIG. 5 is a process flowchart showing a method of manufacturing the camera module of the second embodiment.

A method of manufacturing the camera module of the second embodiment of the present invention will be explained below. FIG. 5 is a process flowchart showing the camera module manufacturing method of the second embodiment.

The manufacturing method of the second embodiment is obtained by deleting step S8 from the process flowchart of the first embodiment shown in FIG. 3, and the rest of the process flowchart is the same as that of the first embodiment.

The difference of the process flowchart will be described in detail below. The resin mask pattern is left behind on only the second main surface of the silicon substrate 10 immediately below the hollow 18 (step S6), and the second main surface of the silicon substrate 10, which is not protected by the resin mask pattern is etched (step S7). In the first embodiment, the resin mask pattern is removed after that (step S8). In the second embodiment, however, the resin mask pattern is not removed but left behind, and used as the resin mask pattern 31 for reinforcement.

[Third Embodiment]

A camera module of the third embodiment of the present invention will be explained below. The same reference numbers as in the arrangement of the above-mentioned first embodiment denote the same parts, and a repetitive explanation will be omitted.

FIG. 6 is an enlarged sectional view of portions of a silicon semiconductor substrate and glass substrate in the camera module of the third embodiment.

In the first embodiment shown in FIG. 2, a corner is formed between the second main surface of the silicon substrate 10 below the hollow 18 and that of the silicon substrate 10 below the adhesive 20 (in the region except for the hollow 18). This may cause the inconvenience that the stress concentrates to this corner, or an interconnection or the like formed on the corner breaks. The third embodiment prevents these inconveniences by removing the corner. In other words, a curved shape is formed between the second main surface of the silicon substrate 10 below the hollow 18 and that of the silicon substrate 10 below the adhesive 20. The rest of the arrangement and the effects are the same as those of the first embodiment.

A method of manufacturing the camera module of the third embodiment of the present invention will be explained below. FIG. 7 is a process flowchart showing the camera module manufacturing method of the third embodiment.

In the manufacturing method of the third embodiment, etching performed by RIE in step S7 is changed to wet etching in the process flowchart of the first embodiment shown in FIG. 3. The rest of the process flowchart is the same as that of the first embodiment.

The difference of the process flowchart will be described in detail below. The second main surface of the silicon substrate 10, which is not protected by a resin mask pattern is etched by isotropic etching performed by wet etching, instead of anisotropic etching performed by RIE, thereby preventing the formation of a corner.

It is also possible to manufacture the camera module of the third embodiment by using a process flowchart shown in FIG. 8. Instead of resin mask pattern formation (step S6), silicon substrate etching (step S7), and resin mask pattern removal (step S8) shown in FIG. 3, the thickness of the silicon substrate 10 immediately below the adhesive 20 is made smaller than that of the silicon substrate 10 immediately below the hollow 18 by CMP or wet etching in the process flowchart shown in FIG. 8.

The structure of a dicing line portion for dividing a wafer, which is used in the aforesaid embodiments in order to form highly reliable camera modules, will be explained below.

Figure 9:
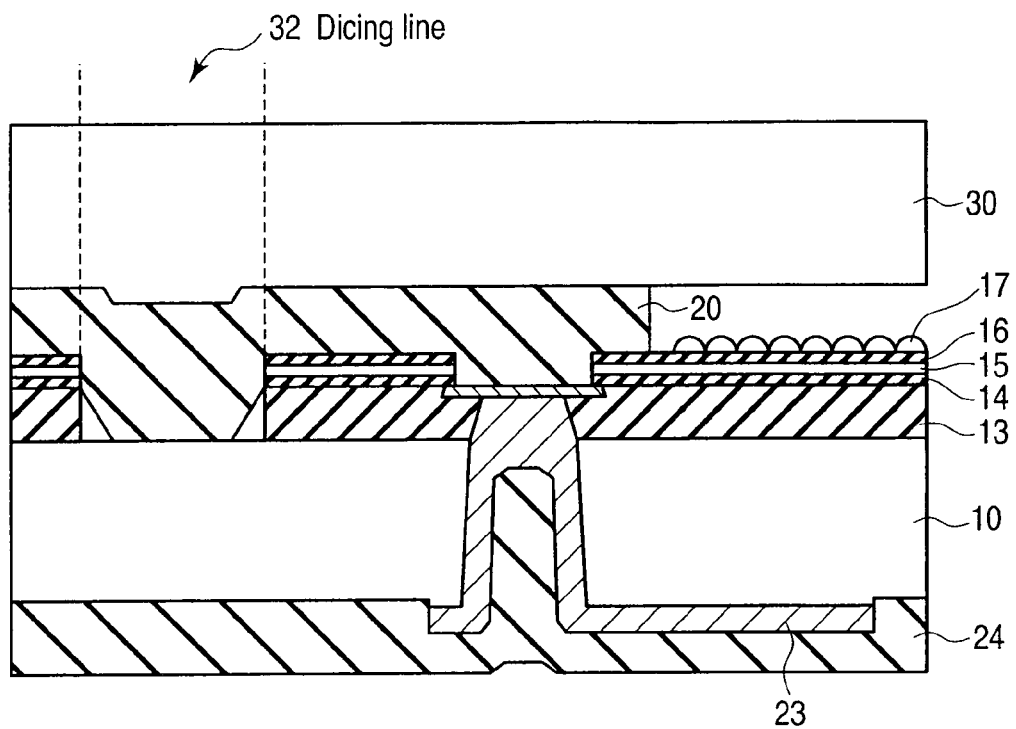
FIG. 9 is a sectional view showing a dicing line structure in a conventional camera module.

FIG. 9 is a sectional view of a conventional camera module. When forming a hollow 18 on an imaging pixel portion of a silicon substrate 10, an adhesive 20 is formed on the first main surface except for the imaging pixel portion, and a multilayered film containing a metal and insulating film and resin materials containing a color filter agent and microlens agent on a dicing line 32 are removed by RIE. Consequently, a step of a few μm is formed on the dicing line portion, and the adhesion of the adhesive 20 decreases to cause peeling.

Figure 10:
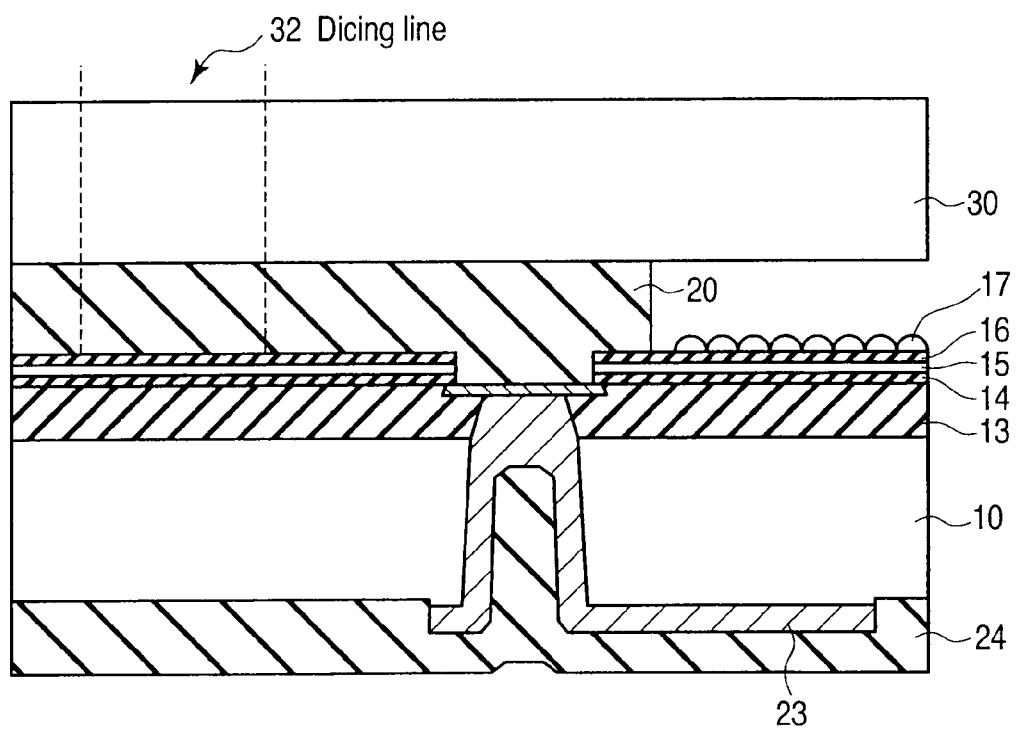
FIG. 10 is a sectional view showing a dicing line structure in the camera module of the embodiment of the present invention.

In the embodiments of the present invention, therefore, in step S1 of the process flowcharts shown in FIGS. 3, 5, 7, and 8, the multilayered film and the resin materials containing the color filter agent and microlens agent on the dicing line 32 are not removed as shown in FIG. 10, thereby preventing the formation of the step on the dicing line 32. When forming the adhesive 20 on the dicing line 32, therefore, peeling hardly occurs because the adhesion of the adhesive 20 increases, so a highly reliable camera module can be formed.

FIG. 11 shows the section of a dicing line structure of a conventional camera module having no through-hole electrode. FIG. 12 shows the section of a dicing line structure of a camera module having no through-hole electrode according to an embodiment. The structure and effect of the dicing line portion in the embodiment shown in FIG. 12 are the same as those described above.

In the embodiment of the present invention as has been explained above, the thickness of the semiconductor substrate below the hollow when viewed from the light-transmitting substrate is made larger than that of the semiconductor substrate below the adhesive. Therefore, even when the hollow is formed on the imaging elements and the semiconductor substrate is formed thin in order to decrease the substrate thickness, it is possible to reduce the inconvenience that the semiconductor substrate is broken or bent in the region where the hollow is formed.

The embodiment of the present invention can provide a semiconductor package which, even when a hollow is formed on imaging elements and a semiconductor substrate is thinned, can reduce the inconvenience that the semiconductor substrate is broken or bent in the region where the hollow is formed, and can provide a camera module using the semiconductor package.

Also, the embodiments described above can be practiced not only singly but also in the form of an appropriate combination. In addition, the above-mentioned embodiments include inventions in various stages. Therefore, the inventions in various stages can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor package comprising:
   a semiconductor substrate having a first main surface and a second main surface opposite to the first main surface;
   a solid-state imaging element formed on the first main surface of the semiconductor substrate;
   an electrode pad formed on the first main surface of the semiconductor substrate;
   a light-transmitting substrate placed on a patterned adhesive to form a hollow on the solid-state imaging element,
   wherein the semiconductor substrate further includes a third surface located opposite to the first main surface below the patterned adhesive, the third surface being parallel to the first and second main surfaces and a distance between the first main surface and the second main surface of the semiconductor substrate is greater than a distance between the first main surface and the third surface of the semiconductor substrate; and
   a through-hole electrode formed to extend through a portion of the semiconductor substrate located between the first main surface and the third surface below the electrode pad.

2. The package according to claim 1, wherein the through-hole electrode is formed in the semiconductor substrate below the adhesive, and the distance between the first main surface and the second main surface of the semiconductor substrate that are located under the hollow is greater than a distance between the first main surface and the third surface of the semiconductor substrate.

3. The package according to claim 1, wherein the through-hole electrode includes an insulating film formed on an inner surface of a through hole formed from the third surface to the first main surface, and a conductive film formed on the insulating film.

4. The package according to claim 3, wherein the insulating film and the conductive film are formed on the third surface, and an external terminal is formed on the conductive film on the third surface.

5. The package according to claim 1, wherein a reinforcing resin member is formed on the second main surface of the semiconductor substrate below the hollow.

6. The package according to claim 1, wherein a curved shape is formed at a transition from the second main surface of the semiconductor substrate below the hollow to the third surface of the semiconductor substrate below the adhesive.

7. The package according to claim 1, further comprising:
a color filter formed opposite to the solid-state imaging element; and
a microlens formed on the color filter to be opposed to the solid-state imaging element.

8. A semiconductor package comprising:
a semiconductor substrate having a first main surface and a second main surface opposite to the first main surface;
a solid-state imaging element formed on the first main surface of the semiconductor substrate;
an electrode pad formed on the first main surface of the semiconductor substrate;
a through-hole electrode formed to extend through a portion of the semiconductor substrate which is located between the first main surface and second main surface, and which is located under the electrode pad, the through-hole electrode having a side surface in the semiconductor substrate located between the first main surface and the second main surface; and
a light-transmitting substrate placed on a patterned adhesive to form a hollow on the solid-state imaging element,
wherein a portion of the second main surface of the semiconductor substrate that does not include the side surface, that is parallel to the first main surface, and that is located adjacent to the through hole electrode and under the adhesive is recessed more with respect to a portion of the second main surface of the semiconductor substrate that is located under the hollow.

9. The package according to claim 8, wherein the through-hole electrode is formed in the semiconductor substrate below the adhesive, and a distance between the portions of the first main surface and the second main surface of the semiconductor substrate that are located under the hollow is greater than a distance between portions of the first main surface and second main surface of the semiconductor substrate that are located close to the through-hole electrode.

10. The package according to claim 8, wherein the through-hole electrode includes an insulating film formed on an inner surface of a through hole formed from the second main surface to the first main surface, and a conductive film formed on the insulating film.

11. The package according to claim 10, wherein the insulating film and the conductive film are formed on the second main surface, and an external terminal is formed on the conductive film on the second main surface.

12. The package according to claim 8, wherein a reinforcing resin member is formed on the second main surface of the semiconductor substrate below the hollow.

13. The package according to claim 8, wherein a curved shape is formed between the second main surface of the semiconductor substrate below the hollow and that of the semiconductor substrate below the adhesive.

14. The package according to claim 8, further comprising:
a color filter formed opposite to the solid-state imaging element; and
a microlens formed on the color filter to be opposed to the solid-state imaging element.

15. A camera module comprising:
a semiconductor package cited in claim 1;
an infrared cut filter formed on the light-transmitting substrate of the semiconductor package; and
an imaging lens formed on the infrared cut filter.

* * * * *